United States Patent
Arakawa et al.

(10) Patent No.: US 6,528,337 B1
(45) Date of Patent: Mar. 4, 2003

(54) PROCESS OF PRODUCING SEMICONDUCTOR LAYER STRUCTURE

(75) Inventors: Satoshi Arakawa, Tokyo (JP); Toshikazu Mukaihara, Tokyo (JP); Nobumitsu Yamanaka, Yokohama (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/544,982

(22) Filed: Apr. 7, 2000

(30) Foreign Application Priority Data

Apr. 8, 1999 (JP) .......................................... 11-101432

(51) Int. Cl.$^7$ .............................................. H01L 21/00
(52) U.S. Cl. ............................... 438/22; 438/46; 438/47
(58) Field of Search ........................... 438/22, 24, 428, 438/429, 483

(56) References Cited

U.S. PATENT DOCUMENTS

| | | | | | |
|---|---|---|---|---|---|
| 5,469,459 A | * | 11/1995 | Okuda et al. | .................. | 372/46 |
| 5,723,380 A | * | 3/1998 | Iwasaki | | |
| 5,753,933 A | * | 5/1998 | Morimoto | .................... | 257/14 |
| 5,862,168 A | * | 1/1999 | Schllling et al. | ............... | 372/50 |
| 5,882,951 A | * | 3/1999 | Bhat | .......................... | 438/40 |
| 5,913,107 A | * | 6/1999 | Sakata | ........................ | 438/41 |
| 5,914,496 A | * | 6/1999 | Thijs et al. | .................... | 257/14 |
| 6,013,539 A | * | 1/2000 | Kashima et al. | ............... | 438/31 |
| 6,028,875 A | * | 2/2000 | Knight et al. | .................. | 372/46 |
| 6,030,452 A | * | 2/2000 | Takeuchi | .................... | 117/104 |
| 6,110,756 A | * | 8/2000 | Otsuka et al. | .................. | 438/41 |
| 6,147,364 A | * | 11/2000 | Itaya et al. | .................... | 257/76 |
| 6,150,667 A | * | 11/2000 | Ishizaka et al. | ............... | 257/21 |
| 6,229,836 B1 | * | 5/2001 | Okuda | .......................... | 372/48 |
| 6,383,829 B1 | * | 5/2002 | Sakata | ......................... | 438/31 |
| 2001/0010701 A1 | * | 8/2001 | Furushima | .................... | 372/50 |
| 2001/0040908 A1 | * | 11/2001 | Munakata et al. | ............ | 372/46 |

* cited by examiner

*Primary Examiner*—Savitri Mulpuri
(74) *Attorney, Agent, or Firm*—Oblon, Spivak, McClelland, Maier & Neustadt, P.C.

(57) ABSTRACT

Disclosed is a process of producing a semiconductor layer structure which emits lights with a plurality of luminescence wavelengths from the same quantum well structure. The layer structure has a layer structure which has the quantum well structure located between a lower light-confinement layer and an upper light-confinement layer. At least a part of the quantum well structure is an area which has a shorter luminescence wavelength than those of the other portions. This area is produced by stacking a lower cladding layer, the lower light-confinement layer, the quantum well structure, the upper light-confinement layer and a first semiconductor layer having a first conductivity type on a semiconductor substrate by epitaxial growth and further stacking a second semiconductor layer having the opposite conductivity type to that of the first semiconductor layer on the entire surface or a partial surface of the first semiconductor layer. This second semiconductor layer may be removed after the formation.

13 Claims, 10 Drawing Sheets

PROCESS OF PRODUCING SEMICONDUCTOR LAYER STRUCTURE

BACKGROUND OF THE INVENTION

1. Field of the Invention

The present invention relates generally to a process of producing a semiconductor layer structure which is used in a semiconductor light emitting device. More particularly, this invention relates to a process of producing a novel semiconductor layer structure which can ensure integration of a semiconductor laser and active devices, such as a photodiode, and integration of those active devices and an optical waveguide.

2. Prior Art

FIG. 1 shows one example A0 of a layer structure which is used in a semiconductor laser device. The layer structure A0 in the semiconductor laser device is realized as follows. A lower cladding layer 2 of Se-doped n-type InP (carrier density of $1 \times 10^{18} cm^{-3}$) having a thickness of 500 nm is deposited on a substrate 1 of n-type InP. Sequentially stacked on the lower cladding layer 2 are a 40-nm thick lower light-confinement layer 3a of GaInAsP ($\lambda g=1.1$ μm), a strained multi-quantum well structure 4 which is comprised of a 10-nm thick well layer of GaInAsP (strain: +1%) and a 10-nm thick barrier layer of GaInAsP ($\lambda g=1.1$ μm), and a 40-nm thick upper light-confinement layer 3b of GaInAsP ($\lambda g=1.1$ μm). On the upper light-confinement layer 3b is formed a 2000-nm thick upper cladding layer 5 of Zn-doped p-type InP (carrier density of $1 \times 10^{18} cm^{-3}$).

A 300-nm thick contact layer (not shown) of Zn-doped p-type GaInAs layer is formed on the upper cladding layer 5 and is then subjected to predetermined photolithography and etching, thereby forming, for example, a ridge optical waveguide. An unillustrated upper electrode is formed on the ridge optical waveguide and an unillustrated lower electrode is formed on the back surface of the substrate 1. This completes a semiconductor laser device.

For this semiconductor laser device with the layer structure A0 constructed in the above-described manner, the wavelength of light emitted from the quantum well structure 4 becomes 1300 nm.

To provide a semiconductor light emitting device with enhanced functions and to integrate the device, an attempt is made to integrate semiconductor layer structures having various luminescence wavelength characteristics on the same semiconductor substrate. In this approach, a slab layer structure, such as the layer structure A0 as shown in FIG. 1, is temporarily formed, part of the layer structure is etched out to the lower cladding layer 2 to locally leave the layer structure A0 whose luminescence wavelength becomes 1300 nm, then another semiconductor material is grown again on the etched-out portion to form a layer structure which shows another luminescence wavelength.

As an alternative approach, a crystallization-preventing mask of, for example silicon nitride, is formed into a predetermined pattern in the surface of layer structure having specific luminescence characteristics and another semiconductor material is selectively grown on the unmasked surface.

According to the conventional semiconductor laser devices, as apparent from the above, even if layer structures having different luminescence characteristics are integrated monolithically on the same substrate, the integrated layer structure is not formed of a single quantum well structure, but is formed of a complex of a plurality of quantum well structures which are arranged side by side, and show different luminescence characteristics, respectively.

That is, the conventional semiconductor laser devices are not designed to provide plural types of luminescence characteristics from a single quantum well structure.

The present inventors stacked an Se-doped n-type InP layer on the entire surface of the upper cladding layer 5 of p-type InP having a thickness of 100 nm in the layer structure A0 shown in FIG. 1 and measured the photoluminescence (PL) of a layer structure L in the layer structure.

As a result, the luminescence wavelength of the quantum well structure 4 was shifted toward the short-wavelength side. Specifically, with the Se-doped n-type InP layer having carrier density of $1 \times 10^8 cm^{-3}$ and a thickness of 1000 nm, the luminescence wavelength of the quantum well structure 4 became 1250 nm.

The present inventors etched out the temporary Se-doped n-type InP layer to return the layer structure to the one shown in FIG. 1 and then likewise measured the photoluminescence (PL) of the resultant layer structure. The luminescence wavelength of the quantum well structure 4 did not return to the original wavelength of 1300 nm but stayed at 1250 nm.

It was also found that the luminescence wavelength of the quantum well structure 4 would be shifted toward the short-wavelength side even if the thickness of the Zn-doped p-type InP layer located directly above the quantum well structure 4 was changed or further the carrier density was changed.

After the formation of the aforementioned Se-doped n-type InP layer, heating at the layer-forming temperature was maintained for about 30 minutes. This increased the amount of the shift of the luminescence wavelength of the quantum well structure 4 toward the short-wavelength side is seen.

The following is the summary of the above experimental results.

(1) When an n-type InP layer is formed on the p-type InP layer 5 in the layer structure A0 shown in FIG. 1, the luminescence wavelength of that part of the quantum well structure which is located directly below the n-type InP layer is shifted toward the short-wavelength side for some unknown reason.

(2) The above phenomenon occurs even after the n-type InP layer is removed. That is, once the n-type InP layer is formed on the p-type InP layer, that part of the quantum well structure which is located directly below the n-type InP layer is transferred to a short-wavelength light emitting area, regardless of whether or not the n-type InP layer thereafter exists.

(3) The amount of the shift of the luminescence wavelength toward the short-wavelength side is changed by the thickness of the p-type InP layer formed on the quantum well structure or the carrier density.

(4) Keeping heating at the layer-forming temperature after the formation of an n-type InP layer on a p-type InP layer increases the amount of the shift of the luminescence wavelength of the quantum well structure that is located directly below the n-type InP layer toward the short-wavelength side.

The above new findings led the present inventors to have the following idea. If that portion of the layer structure A0 shown in FIG. 1 where the n-type InP layer is stacked on the p-type InP layer is changed, that part of the quantum well structure that is located directly below the stacked portion serves as a short-wavelength light emitting area, and the other portion than the stacked portion stays as an area which emits light with the designed wavelength of the quantum well structure. It is therefore eventually possible to form areas with a plurality of luminescence wavelengths in the same quantum well structure in a planar fashion.

Based on this idea as well as the above findings (1) to (4), the present inventors made various studies to develop a process of producing a semiconductor layer structure embodying this invention.

OBJECT AND SUMMARY OF THE INVENTION

Accordingly, it is an object of the present invention to provide a novel process of producing a semiconductor layer structure for a semiconductor light emitting device, which can allow even a single quantum well structure to provide a plurality of different luminescence characteristics, unlike the conventional semiconductor layer structures which achieve different luminescence characteristics with a plurality of quantum well structures.

To achieve the above object, according to one aspect of this invention, there is provided a process of producing a semiconductor layer structure comprising the steps of forming a layer structure having a quantum well structure on a semiconductor substrate by epitaxial growth and stacking at least a first semiconductor layer of a first conductivity type in the vicinity of the layer structure; and stacking a second semiconductor layer having an opposite conductivity type to that of the first semiconductor layer on an entire surface or a partial surface of the first semiconductor layer, so that at least one part of the quantum well structure becomes an area which emits light with a shorter wavelength than those of lights from the other portions.

The second semiconductor layer may be removed after the layer thereof. After the stacking the second semiconductor layer, heating at the forming temperature of the second semiconductor layer may be maintained.

Specifically, the present invention provides a process of producing a semiconductor layer structure where the layer structure comprises a lower cladding layer, a quantum well structure and an upper cladding layer, the semiconductor substrate is formed of n-type InP, the first semiconductor layer is formed of Zn-doped p-type InP and the second semiconductor layer is formed of n-type InP.

DETAILED DESCRIPTION OF THE INVENTION

Figure 2:
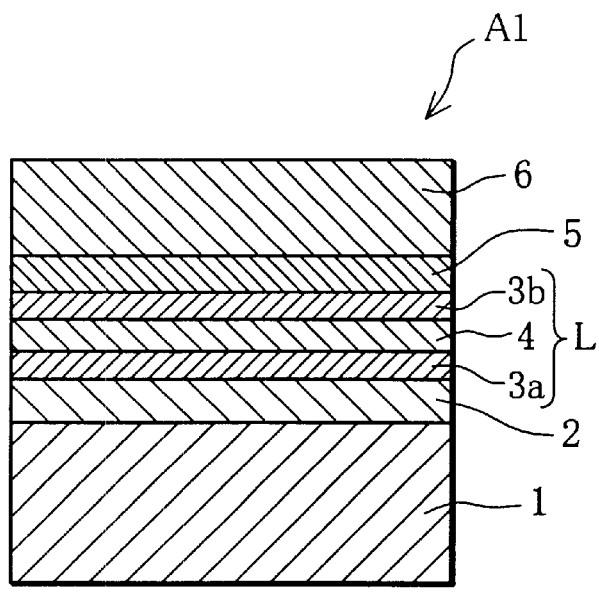
FIG. 2 is a cross-sectional view exemplifying a layer structure A1 according to the process of this invention.

FIG. 2 exemplifies a fundamental layer structure A1 produced by the process of this invention.

This layer structure A1 has a lower cladding layer 2 stacked on a semiconductor substrate 1 by, for example, MOCVD. A lower light-confinement layer 3a, a quantum well structure 4 which is designed to emit light at a specific wavelength ($\lambda_0$) and an upper light-confinement layer 3b are stacked in order on this lower cladding layer 2, thereby yielding a layer structure L. Further, a first semiconductor layer 5 of an n-type or p-type semiconductor is formed as an upper cladding layer on the upper light-confinement layer 3b of the layer structure L. On the first semiconductor layer 5 is formed a second semiconductor layer 6 of a semiconductor having the opposite conductivity type to that of the first semiconductor layer 5.

If an n-type semiconductor substrate, for example, is used as the substrate 1, the lower cladding layer 2 is also formed of an n-type semiconductor, the first semiconductor layer 5 is formed of a p-type semiconductor, and the second semiconductor layer 6 is formed of an n-type semiconductor. If the substrate 1 is of a p-type semiconductor, on the other hand, the lower cladding layer 2 is formed of a p-type semiconductor, the first semiconductor layer 5 is formed of an n-type semiconductor, and the second semiconductor layer 6 is formed of a p-type semiconductor.

It is preferable that the substrate 1 of the layer structure A1 be an n-type InP substrate on which the lower cladding layer 2 of n-type InP, the lower light-confinement layer 3a of i type GaInAsP, the quantum well structure 4, the upper light-confinement layer 3b of i type GaInAsP, the upper cladding layer (first semiconductor layer) 5 of p-type InP and the second semiconductor layer 6 of n-type InP are stacked.

As the second semiconductor layer 6 is stacked on the entire top surface of the quantum well structure 4 in this layer structure A1, the energy band is shifted to the high energy side everywhere in the quantum well structure 4 from the planar view point and every portion of the quantum well structure becomes a short-wavelength light emitting area which emits light of a shorter wavelength than the designed wavelength $\lambda_0$. Even when the second semiconductor layer 6 is removed from the layer structure A1, this quantum well structure 4 keeps serving as the short-wavelength light emitting area.

Even when the carrier density of the first semiconductor layer 5 is increased, the luminescence wavelength of the quantum well structure 4 is shifted toward the short-wavelength side. The amount of the shift can also be increased by increasing the carrier density of the second semiconductor layer 6.

In the case where the first semiconductor layer 5 is formed of p-type InP and the second semiconductor layer 6 is formed of n-type InP in the layer structure A1 shown in FIG. 2, the same advantage can be acquired even if a thin GaInAsP layer is intervened between the quantum well structure 4 and the p-type InP layer 5 or between the p-type InP layer 5 and the n-type InP layer 6.

While it is preferable to use Se for an n-type semiconductor and Zn for a p-type semiconductor as dopants which are used in forming the first semiconductor layer 5 and the second semiconductor layer 6, other types of dopants may also be used without any problem.

Figure 3:
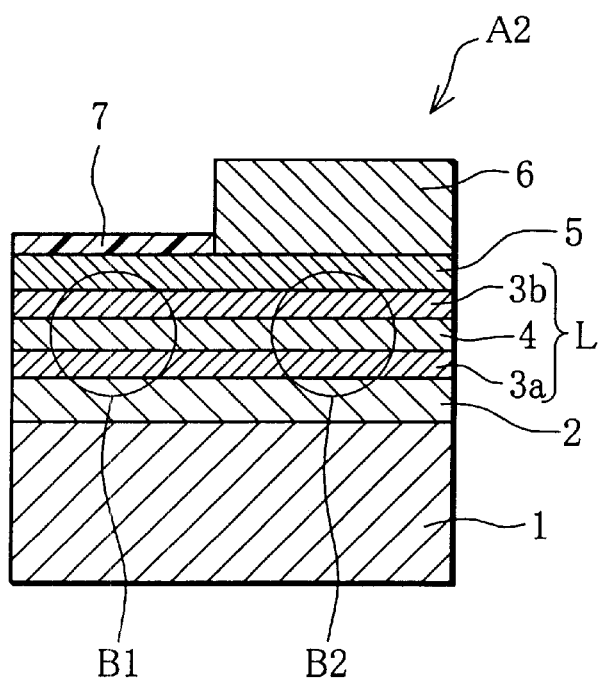
FIG. 3 is a cross-sectional view depicting another layer structure A2.

FIG. 3 shows another layer structure A2 produced by the process of this invention.

Figure 1:
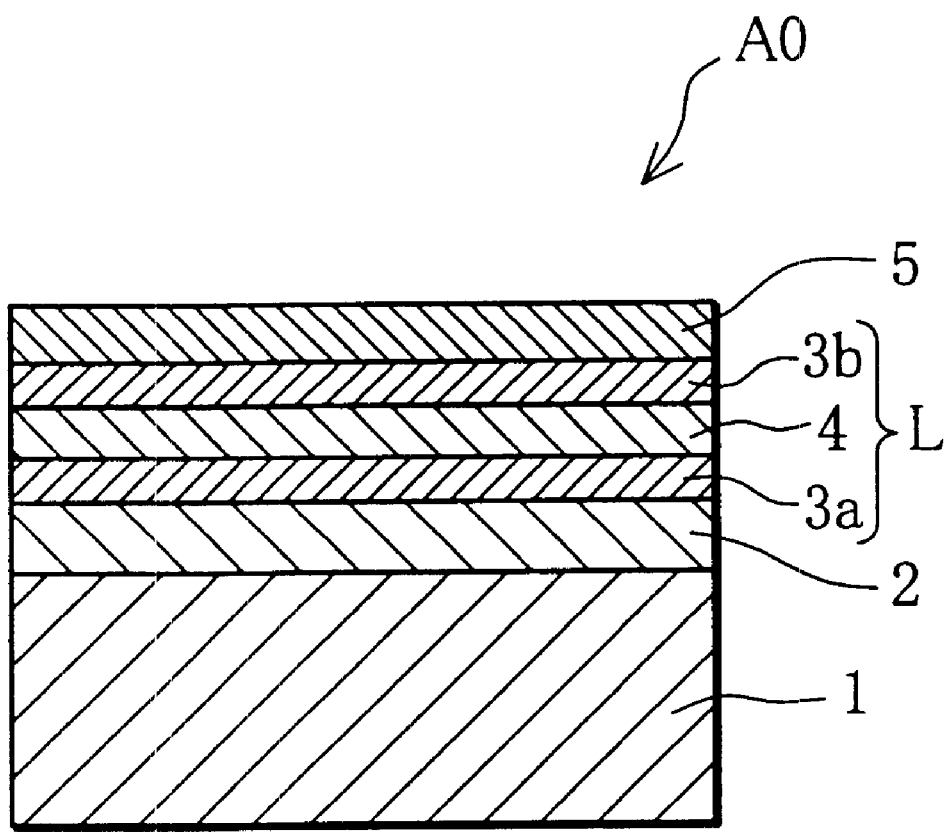
FIG. 1 is a cross-sectional view showing that a layer structure including a layer structure L is formed on an n-type InP substrate.

In producing this layer structure A2, the layer structure A0 shown in FIG. 1 is formed first. Then, a growth-preventing mask 7 of, for example silicon nitride, is formed into a predetermined pattern on a part of the surface of the upper cladding layer (first semiconductor layer) 5 and the second semiconductor layer 6 is selectively grown on the unmasked surface of the upper cladding layer 5.

According to this layer structure A2, a portion B1 of the quantum well structure that is located directly below the growth-preventing mask 7 emits light with the designed wavelength ($\lambda_0$) and a portion B2 of the quantum well structure that is located directly below the second semiconductor layer 6 is a short-wavelength light emitting area which emits light whose wavelength is shorter than the designed wavelength ($\lambda_0$). That is, the layer structure A2 can provide two different luminescence wavelengths from the same quantum well structure 4.

It is to be noted that even when the second semiconductor layer 6 is removed from the layer structure A2, the portion B2 of the quantum well structure 4 located directly below the second semiconductor layer 6 still serves as the short-wavelength light emitting area, as per the aforementioned layer structure A1.

Figure 4:
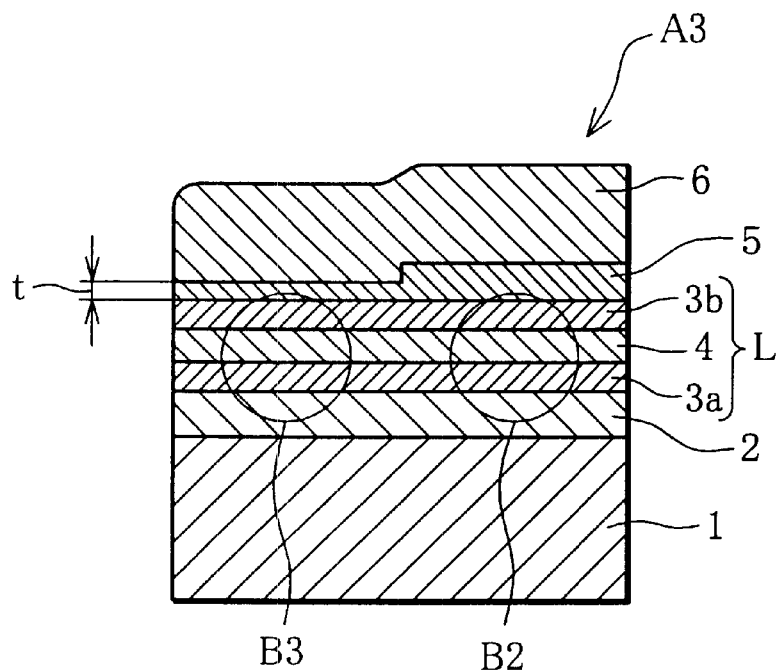
FIG. 4 is a cross-sectional view depicting a different layer structure A3.

FIG. 4 shows a further layer structure A3 produced by the process of this invention.

In producing this layer structure A3, the layer structure A0 shown in FIG. 1 is formed first. Then, an etching-preventing film (not shown) is formed on a part of the surface of the upper cladding layer (first semiconductor layer) 5 and then that portion of the upper cladding layer 5 where the film is not formed is etched out in the thicknesswise direction, leaving the upper cladding layer 5 only by a thickness t. Then, the etching-preventing film is removed, and the second semiconductor layer 6 is stacked on the entire surface of the upper cladding layer 5 that has a step structure.

According to this layer structure A3, a portion B2 of the quantum well structure that is located directly below the portion of the first semiconductor layer 5 which has not been etched out becomes a short-wavelength light emitting area. This short-wavelength light emitting area provides the same luminescence wavelength as the portion B2 shown in FIG. 3.

A portion B3 of the quantum well structure that is located directly below that portion of the first semiconductor layer 5 which has the thickness t as a result of the local etching in the thicknesswise direction and on which the second semiconductor layer 6 is directly stacked is also transformed into a short-wavelength light emitting area. According to this layer structure A3, the wavelength of light coming from the portion B3 of the quantum well structure is varied by changing the thickness t.

It is to be noted that even when the second semiconductor layer 6 is removed from the layer structure A3, the portions B2 and B3 of the quantum well structure 4 still serve as the short-wavelength light emitting areas, as per the aforementioned layer structures A1 and A2.

According to the layer structure produced by the process of this invention, as apparent from the above, different luminescence wavelengths can be acquired from the same quantum well structure 4 by changing the stacking location of the second semiconductor layer on the first semiconductor layer or changing the thickness of the first semiconductor layer.

A description will now be given of the production of, for example, a semiconductor laser device which uses any of the above-described layer structures. In this example, the semiconductor laser device has the layer structure A1.

First, the entire second semiconductor layer 6 (n-type) in the layer structure A1 is temporarily etched out to expose the surface of the p-type first semiconductor layer 5. Then, an n-type semiconductor layer is formed on that surface portion of the first semiconductor layer where the upper electrode will not be formed, thereby forming a current-blocking layer. Then, a p-type semiconductor layer is formed on that surface portion of the first semiconductor layer where the upper electrode will be formed, thereby forming a contact layer. Finally, the upper electrode (p-type electrode) is formed on the contact layer and a lower electrode (n-type electrode) is formed on the bottom surface of the substrate.

Because the entire area of the quantum well structure 4 in this semiconductor laser device has already been transformed into a short-wavelength light emitting area, that portion of the quantum well structure which is located directly below the upper electrode can emit a laser beam whose wavelength is shorter than the designed wavelength ($\lambda_0$). The use of this layer structure can permit an SAS type semiconductor laser device to be produced as follows.

First, the layer structure to the p-type first semiconductor layer 5 shown in FIG. 2 is formed on, for example, n-type InP substrate.

Figure 5:
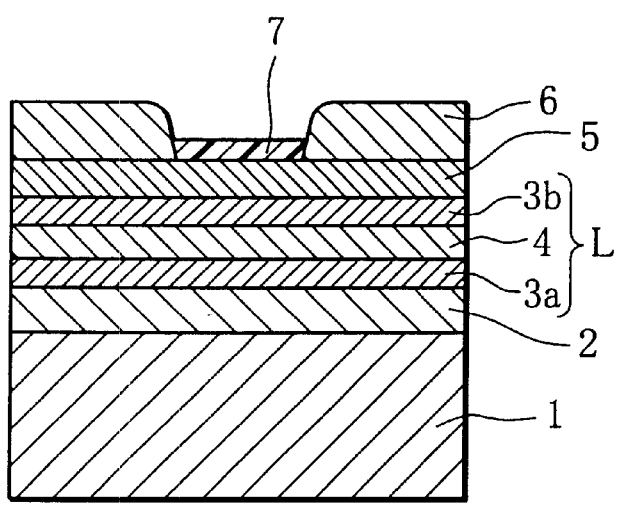
FIG. 5 is a cross-sectional view illustrating a second semiconductor layer stacked on a first semiconductor layer.

Then, as shown in FIG. 5, a stripe mask 7 of, for example, silicon nitride, for preventing crystal growth is formed on that portion of the first semiconductor layer 5 where a current-injection area is to be formed, and, for example, Se-doped n-type InP is selectively grown on the other portion, thereby forming the second semiconductor layer 6.

Figure 6:
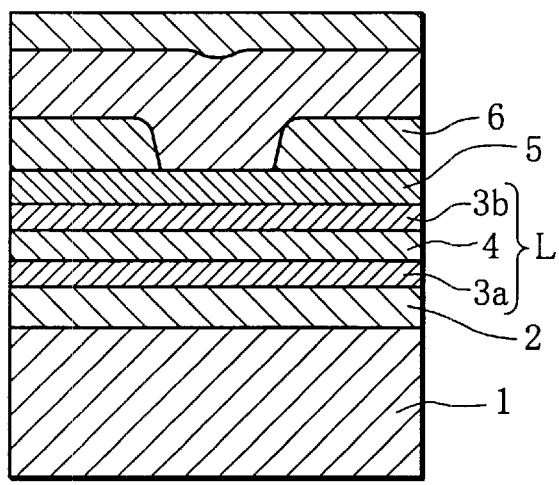
FIG. 6 is a cross-sectional view showing one example of an SAS semiconductor laser device.

Then, the stripe mask 7 is removed to expose the first semiconductor layer 5 (p-type), after which the upper cladding layer of, for example p-type InP and the contact layer of, for example, p-type GaInAs are formed in order on the entire surface (FIG. 6). Finally, the upper electrode (p-type electrode) is formed on the contact layer, and the lower electrode (n-type electrode) is formed on the bottom surface of the substrate 1.

According to this semiconductor laser device, the second semiconductor layer 6 itself serves as a current-blocking layer. That portion of the quantum well structure 4 which is located directly below the second semiconductor layer 6 is a short-wavelength light emitting area. This reduces the refractive index of that portion of the quantum well structure 4 which is located directly below the second semiconductor layer 6. Therefore, that portion of the quantum well structure 4 which is located directly below the current-injection area exhibits the effect of confining the injected current and light towards the traverse direction side. Consequently, this semiconductor laser device demonstrates excellent laser characteristics, such as a reduced threshold current and increased kink generation current.

After the second semiconductor layer in this semiconductor laser device is formed to the desired thickness, maintaining heating at the layer forming temperature can increase the amount of the shift toward the short-wavelength side at that portion of the quantum well structure which is located directly below the second semiconductor layer, i.e., can further reduce the refractive index. This allows the aforementioned confining effect to be demonstrated more prominently.

This means that making the second semiconductor layer (current-blocking layer) thinner can effectively achieve the effect of confining the injected current and light toward the traverse direction side.

To demonstrate the effect of traverse confinement, the conventional semiconductor laser device requires that the current-blocking layer should be made sufficiently thick. As the current-blocking layer is made thicker, however, it is likely to produce defects in the upper cladding layer or cause deterioration of the surface morphology in the subsequent layer forming process, particularly, in the process of forming the upper cladding layer. This probably leads to a reduction in the reliability of the produced semiconductor laser device. Making the current-blocking layer thinner, on the other hand, increases the leak current of the produced semiconductor laser device.

According to the semiconductor laser device which uses the layer structure that is produced by the process of this invention, on the contrary, it is unnecessary to form the current-blocking layer as thick as that of the conventional semiconductor laser device because even if the second semiconductor layer or the current-blocking layer is formed thin, the aforementioned effect of the traverse confinement of light can be demonstrated by keeping heating at the layer forming temperature. This means a reduction in the amount of an expensive organic metal and a reduction in the production cost of the device.

EXAMPLES

Example 1

The layer structure A1 was formed by MOCVD as follows.

The lower cladding layer 2 of Se-doped n-type InP (carrier density of $1 \times 10^{18} cm^{-3}$) having a thickness of 500 nm was stacked on the n-type InP substrate 1, and the lower light-confinement layer 3a of i-type GaInAsP ($\lambda$g=1.1 $\mu$m) having a thickness of 40 nm was stacked on the lower cladding layer 2. Formed on the lower light-confinement layer 3a was the strained multi-quantum well structure 4 which comprised a 10-nm thick well layer of GaInAsP (strain: +1%) and a 10-nm thick barrier layer of GaInAsP ($\lambda$g=1.1 $\mu$m) and was so designed as to have a luminescence wavelength ($\lambda$0) of 1300 nm. Then, the upper light-confinement layer 3b of i-type GaInAsP ($\lambda$g=1.1 $\mu$m) having a thickness of 40 nm was stacked on the strained multi-quantum well structure 4, thus yielding the layer structure L. Then, the upper cladding layer (first semiconductor layer) 5 of Zn-doped p-type InP (carrier density of $5 \times 10^{17} cm^{-3}$) was formed on the upper light-confinement layer 3b, thereby yielding the layer structure A0 as shown in FIG. 1. The second semiconductor layer 6 of Se-doped n-type InP (carrier density of $1 \times 10^{18} cm^{-3}$) having a thickness of 1000 nm was formed on the upper cladding layer 5, thus completing the layer structure A1.

The photoluminescence (PL) of this layer structure A1 was measured. The luminescence wavelength of the quantum well structure 4 was 1250 nm, shifted toward the short-wavelength side by 50 nm from the designed wavelength. The luminescence wavelength of the layer structure acquired by etching out the Se-doped n-type InP layer 6 remained unchanged at 1250 nm.

Example 2

The layer structure A2 was formed by MOCVD as follows.

The layer structure A0 as shown in FIG. 1 was formed in the same manner as done in Example 1.

Then, an silicon nitride film was deposited on a half of the surface of the p-type InP layer 5, thereby forming the growth-preventing mask 7. Then, the second semiconductor layer 6 of Se-doped n-type InP (carrier density of $1 \times 10^{18} cm^{-3}$) having a thickness of 1000 nm was formed on the unmasked surface as done in Example 1, thereby completing the layer structure A2 (FIG. 3).

This layer structure A2 was analyzed by a photoluminescence method. The luminescence wavelength of the portion B1 of the quantum well structure which was located directly below the growth-preventing mask 7 was 1300 nm, and the portion B2 of the quantum well structure which was located directly below the second semiconductor layer 6 was 1250 nm. Apparently, the portion B2 became a short-wavelength light emitting area.

That is, in this layer structure A2, two luminescence wavelengths could be obtained from the single quantum well structure 4.

The photoluminescence of the layer structure obtained by etching out the Se-doped n-type InP layer 6 was likewise measured. The measurements showed that the luminescence wavelength of the portion B of the quantum well structure 4 remained unchanged at 1250 nm.

Example 3

The layer structure A3 was formed by MOCVD as follows.

First, the layer structure A0 as shown in FIG. 1 was formed in the same manner as done in Example 1. Then, an etching-preventing film was deposited on a part of the surface of the Zn-doped p-type InP layer 5 and that portion of the surface where the etching-preventing film was not formed was subjected to etching. At this time, the etching depth of the layer-unformed portion was changed by altering the etching time, thereby variously changing the thickness t of the remaining portion.

Thereafter, the second semiconductor layer 6 of Se-doped n-type InP (carrier density of $1\times10^{18}$cm$^{-3}$) having a thickness of 1000 nm was formed on the entire surface of the Zn-doped p-type InP layer 5 as done in Example 1, thereby completing the layer structure A3.

Figure 7:
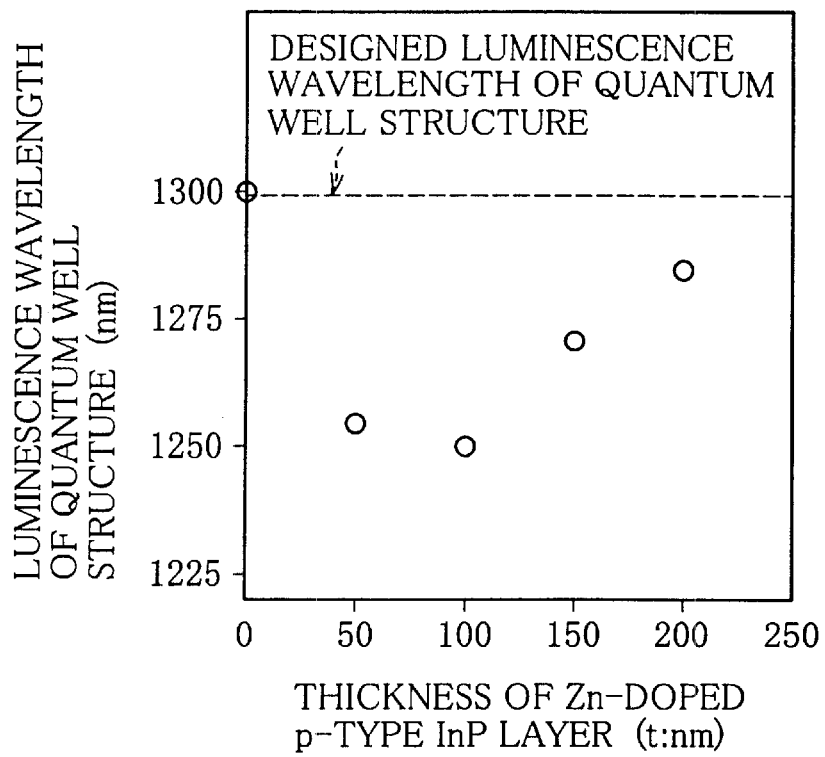
FIG. 7 is a graph showing the relationship between the thickness of a Zn-doped p-type InP layer and the luminescence wavelengths of a quantum well structure.

The luminescence wavelength of the quantum well structure of this layer structure A3 was measured by a photoluminescence method. FIG. 7 shows the correlation between the measured luminescence wavelengths and the thickness t of the Zn-doped p-type InP layer.

As apparent from FIG. 7, as the Zn-doped p-type InP layer becomes thinner, the luminescence wavelength of the portion B3 of the quantum well structure 4 is shifted toward the short-wavelength side.

When the thickness of the Zn-doped p-type InP layer becomes less than 100 nm, the luminescence wavelength of the portion B3 of the quantum well structure 4 shifts to the long-wavelength side. This indicates that the luminescence wavelength of that portion of the quantum well structure which is located directly below the etched portion can be controlled adequately by controlling the etching depth at the time of etching the Zn-doped p-type InP layer.

Example 4

Figure 8:
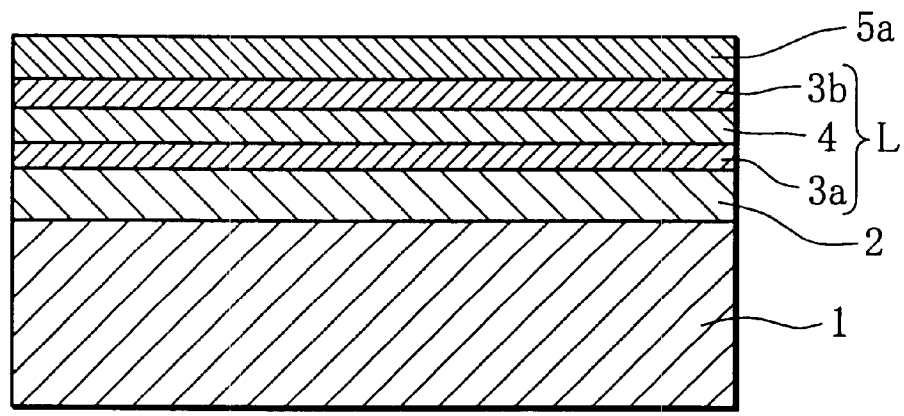
FIG. 8 is a cross-sectional view illustrating a semiconductor layer stacked on a substrate.

As shown in FIG. 8, the lower cladding layer 2 of Se-doped n-type InP (carrier density of $1\times10^{18}$cm$^{-3}$) having a thickness of 500 nm was stacked on the n-type InP substrate 1, and the lower light-confinement layer 3a of i-type GaInAsP ($\lambda$g=1.1 $\mu$m) having a thickness of 40 nm was stacked on the lower cladding layer 2. Formed in order on the lower light-confinement layer 3a were the strained multi-quantum well structure 4, which comprised a 10-nm thick well layer of GaInAsP (strain: +1%) and a 10-nm thick barrier layer of GaInAsP ($\lambda$g=1.1 $\mu$m) and was so designed as to have a luminescence wavelength ($\lambda_o$) of 1340 nm, and the 40-nm thick upper light-confinement layer 3b of i-type GaInAsP ($\lambda$g=1.1 $\mu$m), thus yielding the layer structure L. Then, a 10-nm thick upper cladding layer (first semiconductor layer) 5a of Zn-doped p-type InP (carrier density of $5\times10^{17}$cm$^{-3}$) was formed on the layer structure L.

Figure 9:
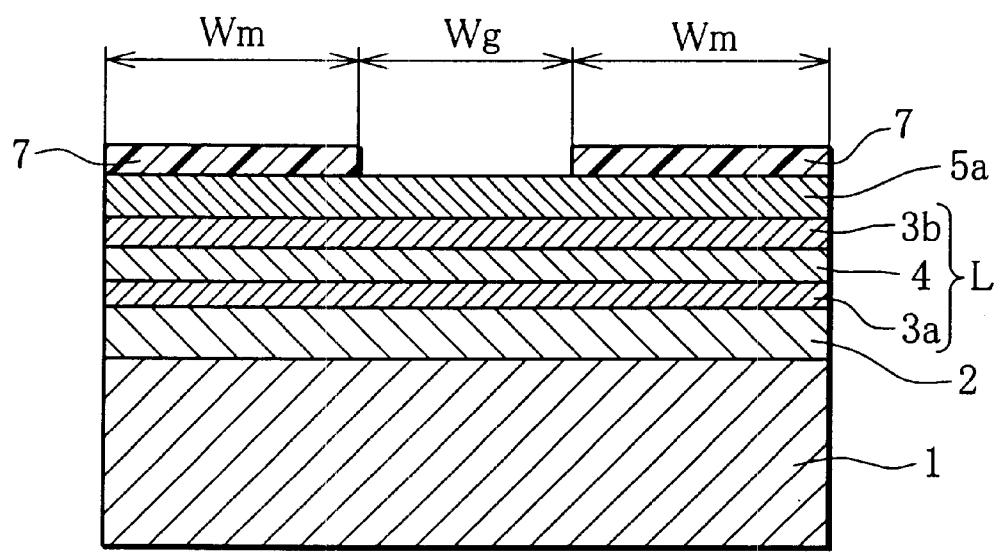
FIG. 9 is a cross-sectional view depicting a mask for selective growth formed on the layer structure in FIG. 8.

Then, masks 7 of silicon nitride having a width Wm with a gap Wg therebetween, as shown in FIG. 9, was formed on the surface of the upper cladding layer 5a. Subsequently, Zn-doped p-type InP (carrier density of $5\times10^{17}$cm$^{-3}$) was selectively grown on the resultant structure followed by selective growth of Se-doped n-type InP (carrier density of $1\times10^{18}$cm$^{-3}$), thereby yielding the layer structure as shown in FIG. 9. As a result, an upper cladding layer 5b having a thickness of 40 nm and the second semiconductor layer 6 having a thickness of 300 nm were formed on the upper cladding layer 5a exposed between the masks 7,7.

Figure 10:
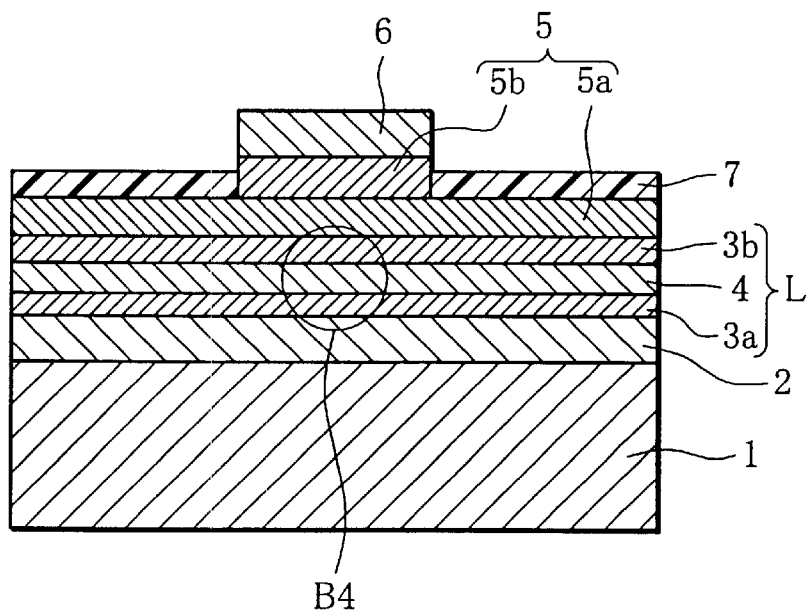
FIG. 10 is a cross-sectional view depicting the formation of an upper cladding layer and the second semiconductor layer.
Figure 11:
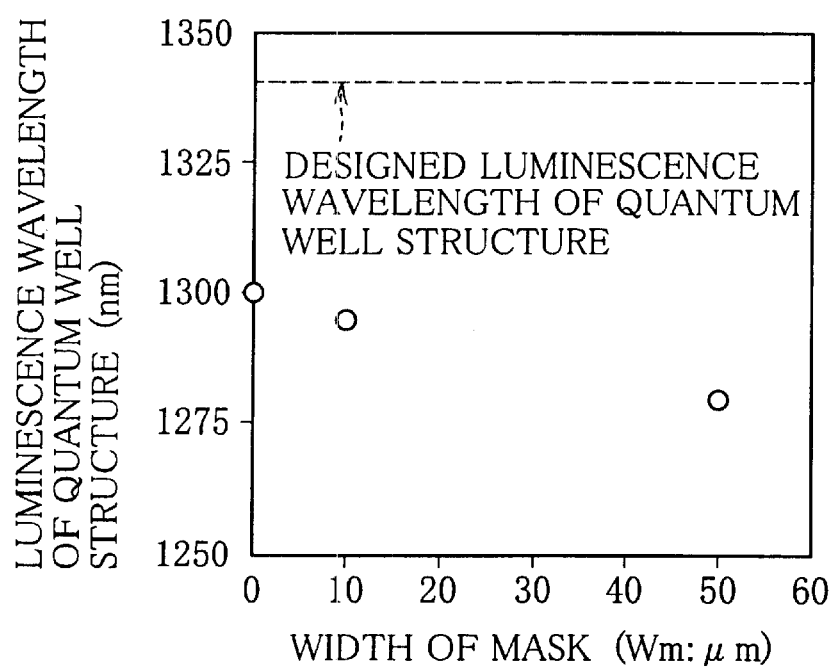
FIG. 11 is a graph showing the relationship between the width of the mask for selective growth and the luminescence wavelengths of the quantum well structure.

With the gap Wg between the masks 7,7 set constant to 15 $\mu$m, the widths Wm of the masks were changed to 50 $\mu$m and 10 $\mu$m at that time, thereby yielding the layer structure as shown in FIG. 10. The photoluminescence of this layer structure was measured. FIG. 11 shows the results of the measurement.

As apparent from FIG. 11, when the mask pattern is set to have Wm of 10 $\mu$m and Wg of 15 $\mu$m, the luminescence wavelength of a portion B4 of the quantum well structure which is located directly below the Se-doped n-type InP layer 6 is shifted toward the short-wavelength side to 1295 nm from the designed wavelength. When the mask pattern is set to have Wm of 50 $\mu$m and Wg of 15 $\mu$m, the luminescence wavelength of the portion B4 is further shifted toward the short-wavelength side to 1280 nm.

That is, the selective-growth based formation of the first semiconductor layer and the second semiconductor layer by controlling the dimension of the mask pattern can control the luminescence wavelength of that portion of the quantum well structure which is located directly below the first and second semiconductor layers.

It is to be noted that even after the Se-doped n-type InP layer 6 in the layer structure shown in FIG. 10 was etched out, the luminescence wavelength of the portion B4 remained unchanged.

Example 5

An SAS type semiconductor laser device which employs the layer structure of this invention was formed by MOCVD as follows.

Figure 12:
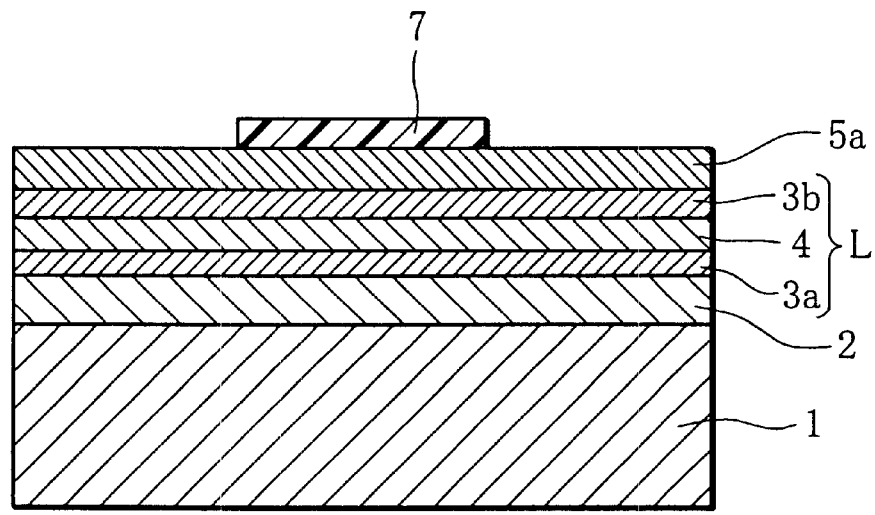
FIG. 12 is a cross-sectional view showing a mask for selective growth formed on the first semiconductor layer during the process of producing an SAS semiconductor laser device.

First, as shown in FIG. 12, the lower cladding layer 2 of Se-doped n-type InP (carrier density of $1\times10^{18}$cm$^{-3}$) having a thickness of 500 nm was stacked on the n-type InP substrate 1. Formed on the lower cladding layer 2 in order were the lower light-confinement layer 3a of i-type GaInAsP ($\lambda$g=1.1 $\mu$m) having a thickness of 40 nm, the strained multi-quantum well structure 4, which comprised a 10nm thick well layer of GaInAsP (strain: +1%) and a 10nm thick barrier layer of GaInAsP ($\lambda$g=1.1 $\mu$m) and was so designed as to have a luminescence wavelength of 1300 nm, and the upper light-confinement layer 3b of i-type GaInAsP ($\lambda$g=1.1 $\mu$m) having a thickness of 40 nm, thereby yielding the layer structure L. Then, the upper cladding layer (first semiconductor layer) 5a of Zn-doped p-type InP (carrier density of $5\times10^{17}$cm$^{-3}$) having a thickness of 100 nm was stacked on the layer structure L, after which the stripe mask 7 of silicon nitride having a width of 5 $\mu$m was formed on this upper cladding layer 5a.

Figure 13:
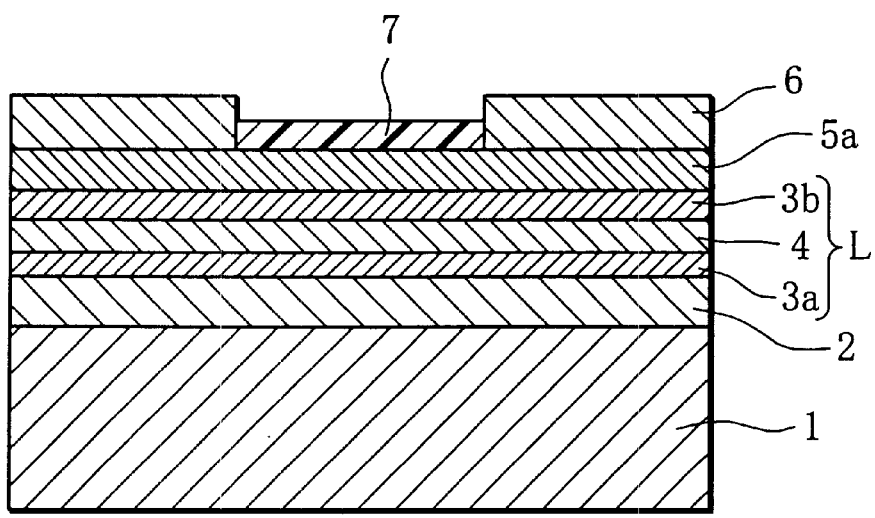
FIG. 13 is a cross-sectional view showing the formation of a current-blocking layer.

Then, the current-blocking layer (second semiconductor layer) 6 of Se-doped n-type InP (carrier density of $1\times10^{18}$cm$^{-3}$) was formed on the unmasked surface of the upper cladding layer 5a (FIG. 13).

Figure 14:
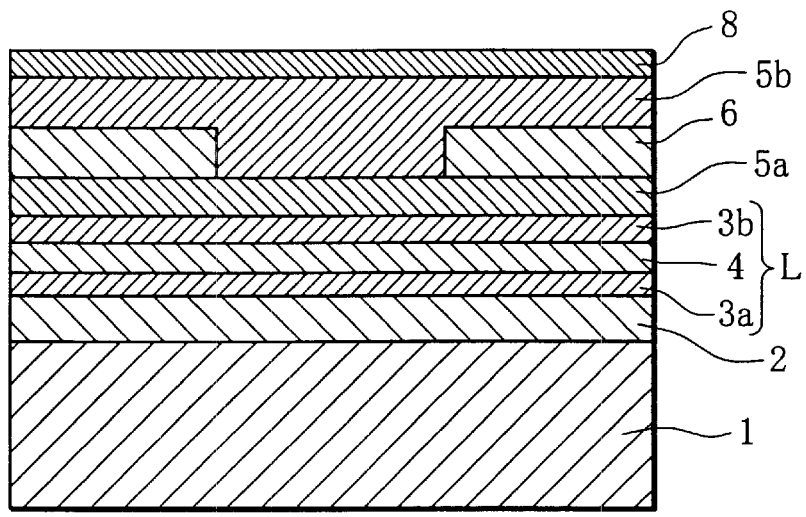
FIG. 14 is a cross-sectional view depicting the formation of the upper cladding layer and a contact layer.

After the stripe mask 7 was removed, the upper cladding layer 5b of Zn-doped p-type InP (carrier density of $1\times10^{18}$cm$^{-3}$) having a thickness of 2000 nm and a contact layer 8 of Zn-doped p-type GaInAs were sequentially stacked on the entire surface of the resultant structure (FIG. 14).

Finally, the upper electrode (not shown) was formed on the contact layer 8 and the lower electrode (not shown) was formed on the bottom surface of the n-type InP substrate 1. This completed the production of the intended SAS type semiconductor laser device.

The band gap of both side portions of the quantum well structure 4 which are located directly below the second semiconductor layer 6 in this SAS type semiconductor laser device is greater than the band gap of the center portion located directly below the second semiconductor layer which is stacked in the portion where the stripe mask is formed. Accordingly, the refractive index of both side portions becomes lower.

The SAS type semiconductor laser device with this structure can therefore ensure refractive index guiding whereas the conventional SAS type semiconductor laser device is of a gain-guiding type. The SAS type semiconductor laser device with the above structure advantageously has a high kink current level at the time of generating high power.

In the production of the above-described laser devices, the first semiconductor layer 5a was formed at a temperature between 500 nm at 650° C., and then heating was continued at the same temperature (650° C.), after which the semiconductor laser device was produced in the same manner as done for Example 5.

At that time, the heating time for the first semiconductor layer 5a after layer formation was changed.

Figure 15:
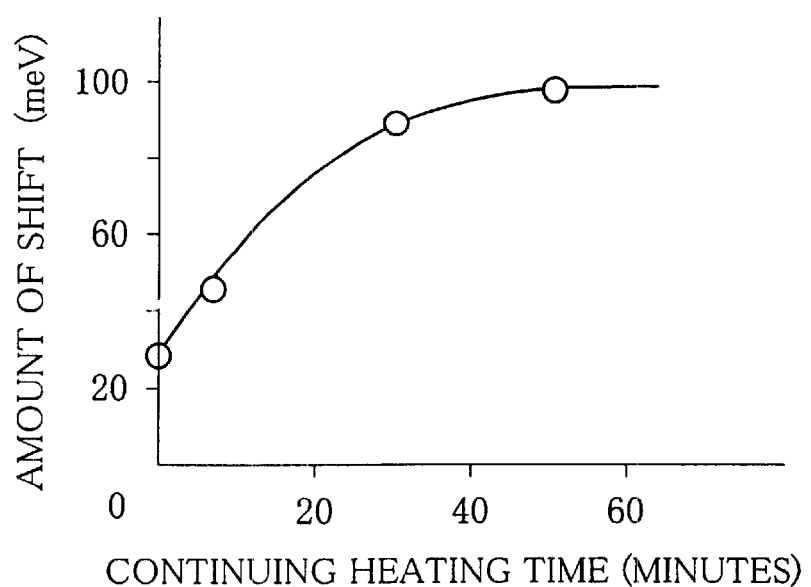
FIG. 15 is a graph showing the relationship between the time for which heating is kept after the formation of the first semiconductor layer and the shift amount of the energy of the quantum well structure.

The amount of the shift of the luminescence energy at that portion of the quantum well structure which is located directly below the first semiconductor layer 5a in each produced laser device was measured. FIG. 15 shows the correlation between the measured energy-shift amounts and the time for which heating continues.

As apparent from FIG. 15, when, after the layer formation of the first semiconductor layer (current-blocking layer) 5a, heating is kept at the temperature of the layer forming temperature at that time, the amount of the shift of the luminescence energy at that portion of the quantum well structure which is located directly below the first semiconductor layer 5a is increased sequentially. When heating continues for more than 30 minutes, the amount of the shift becomes about 100 meV. This shift amount permits the same transverse confinement effect as obtained in the case where the 2000-nm thick current-blocking layer is formed of n-type InP.

Example 6

A multi-wavelength semiconductor laser device was formed as follows.

First, as shown in FIG. 8, the lower cladding layer 2 of Se-doped n-type InP (carrier density of $1 \times 10^{18} cm^{-3}$) having a thickness of 500 nm was stacked on the n-type InP substrate 1. Formed on the lower cladding layer 2 in order were the lower light-confinement layer 3a of i-type GaInAsP ($\lambda g=1.1\ \mu m$) having a thickness of 40 nm, the strained multi-quantum well structure 4, which comprised a 10nm thick well layer of GaInAsP (strain: +1%) and a 10nm thick barrier layer of GaInAsP ($\lambda g=1.1\ \mu m$) and was so designed as to have a luminescence wavelength of 1340 nm, and the upper light-confinement layer 3b of i-type GaInAsP ($\lambda g=1.1\ \mu m$) having a thickness of 40 nm, thereby yielding the layer structure L. Then, the upper cladding layer (first semiconductor layer) 5a of Zn-doped p-type InP (carrier density of $5 \times 10^{17} cm^{-3}$) having a thickness of 10 nm was stacked on the layer structure L.

Figure 16:
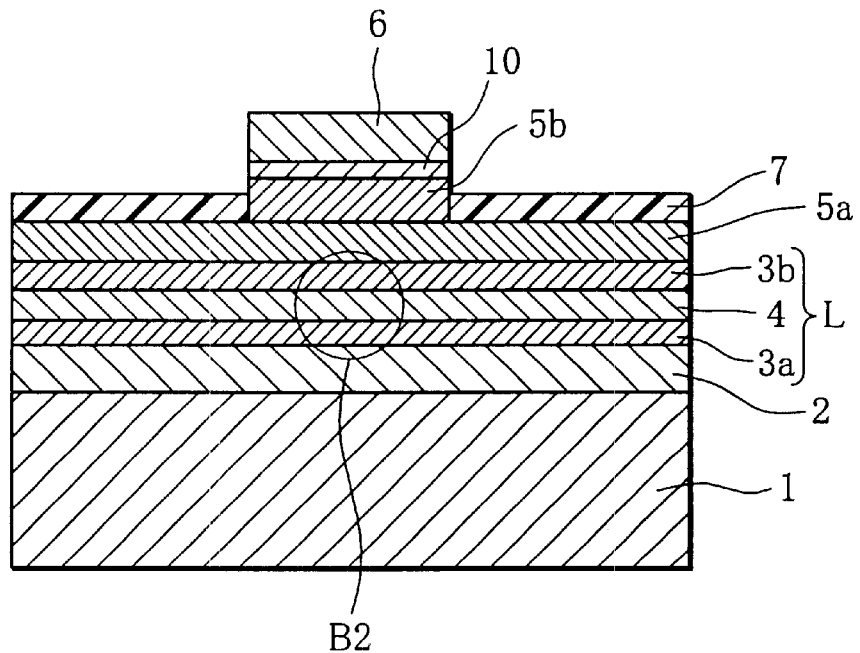
FIG. 16 is a cross-sectional view illustrating the selective growth of the first semiconductor layer and the second semiconductor layer during the process of producing a multi-wavelength semiconductor laser device.

Then, as shown in FIG. 9, a pattern of the masks 7 for selective growth having a gap Wg of 15 $\mu m$ and widths Wm of 10 to 50 $\mu m$ was formed of silicon nitride on the upper cladding layer 5a. Successively selectively formed on the surface of the resultant structure were the upper cladding layer 5b of Zn-doped p-type InP (carrier density of $5 \times 10^{17} cm^{-3}$) having a thickness of 30 nm, an etching stop layer 10 of GaInAsP ($\lambda g=1.2\ \mu m$) having a thickness of 5 nm and the layer (second semiconductor layer) 6 of Se-doped n-type InP (carrier density of $1 \times 10^{18} cm^{-3}$) having a thickness of 300 nm. This yielded the layer structure as shown in FIG. 16.

By this point, the portion B2 of the quantum well structure which was located directly below the Se-doped n-type InP layer 6 had been transferred to a short-wavelength light emitting area.

Figure 17:
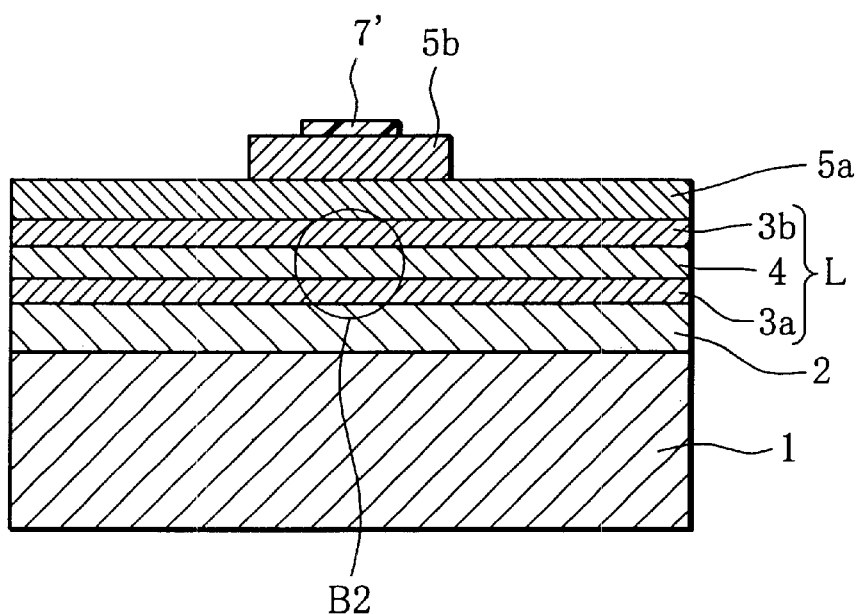
FIG. 17 is a cross-sectional view showing an etching-inhibiting film after the second semiconductor layer and the mask for selective growth are removed.
Figure 18:
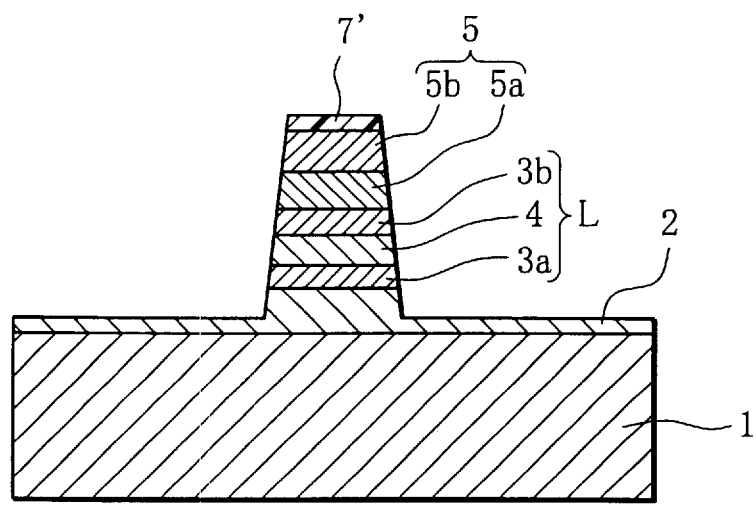
FIG. 18 is a cross-sectional view showing the formation of a mesa structure.

Then, the Se-doped n-type InP layer 6, the etching stop layer 10 and the masks 7 for selective growth were removed by etching to expose the Zn-doped p-type InP layer 5b. Then, as shown in FIG. 17, a stripe mask 7' having a width of 4 $\mu m$ was formed of silicon nitride on the center portion of the surface of the Zn-doped p-type InP layer 5b. Then, the entire structure was subjected to etching to etch out to the lower cladding layer 2, thereby yielding a mesa structure as shown in FIG. 18.

Figure 19:
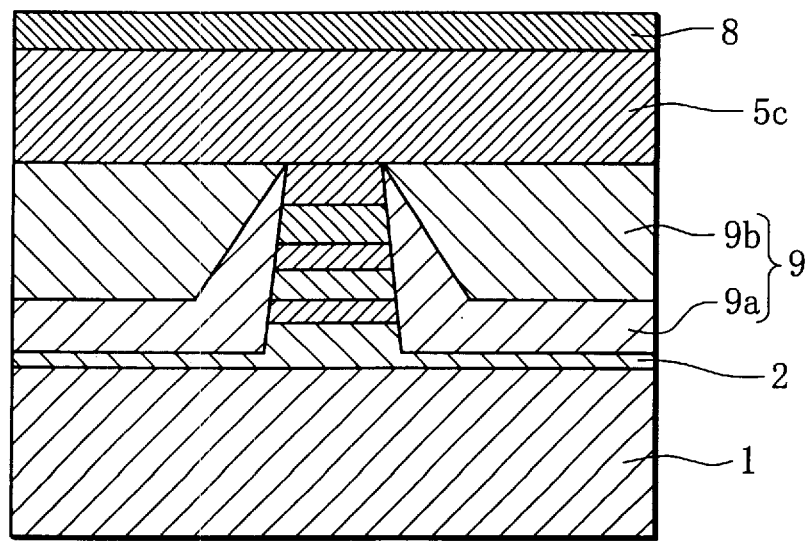
FIG. 19 is a cross-sectional view showing the mesa structure in FIG. 18 buried with the upper cladding layer and contact layer.

Then, both sides of the mesa structure were sequentially buried with a Zn-doped p-type InP layer 9a and Se-doped n-type InP layer 9b, thereby forming a current-blocking layer 9. Then, the stripe mask 7' was removed, and sequentially, an upper cladding layer 5c of Zn-doped p-type InP (carrier density of $1 \times 10^{18} cm^{-3}$) having a thickness of 2000 nm and the contact layer 8 of Zn-doped p-type GaInAs were stacked in order on the entire top surface (FIG. 19).

Finally, the upper electrode was formed on the contact layer 8 and the lower electrode was formed on the bottom surface of the substrate 1. This completed the production of the intended semiconductor laser device.

In the case of this laser device, as apparent from FIG. 11, setting the width of the masks 7 for selective growth in, for example, FIG. 16 to 10 $\mu m$ ensures a luminescence wavelength of 1295 nm and setting the mask width to 50 $\mu m$ ensures a luminescence wavelength of 1280 nm. By setting the mask width to a proper value within the range of 10 $\mu m$ to 50 $\mu m$, the luminescence wavelength becomes a proper value between the aforementioned two luminescence wavelengths. The luminescence wavelength of that portion of the quantum well structure which is not affected by the masks 7 becomes 1300 nm or the designed wavelength ($\lambda_0$) and the luminescence wavelength of that portion of the quantum well structure which is located directly under the masks 7 becomes 1320 nm.

That is, this laser device functions as an array which has areas with luminescence wavelengths from 1290 to 1320 nm on the same substrate.

As apparent from the foregoing description, the semiconductor layer structure of this invention can provide a plurality of luminescence wavelengths from the same one quantum well structure. Therefore, the use of the layer structure can ensure integration of portions which have different luminescence wavelengths on the same substrate and can ensure integration of a semiconductor laser device and active devices, such as a photodiode, and integration of those active devices and an optical waveguide. Therefore, the semiconductor layer structure of this invention has a significant industrial merit.

What is claimed is:

1. A process of producing a semiconductor layer structure comprising the steps of:

forming a layer structure having a lower cladding layer of a second conductivity type and a quantum well structure on the lower cladding layer on a semiconductor substrate by epitaxial growth and stacking at least a first semiconductor layer of a first conductivity type on said layer structure; and stacking a second semiconductor layer having an opposite conductivity type to that of said first semiconductor layer on an entire surface or a partial surface of said first semiconductor layer.

2. A process of producing a semiconductor layer structure comprising the steps of:

forming a layer structure having a lower cladding layer of a second conductivity type and a quantum well structure on the lower cladding layer on a semiconductor substrate by epitaxial growth and stacking at least a first semiconductor layer of a first conductivity type on said layer structure; and stacking a second semiconductor layer having an opposite conductivity type to that of said first semiconductor layer on an entire surface or a partial surface of said first semiconductor layer, further including a step of removing said second semiconductor layer after formation of said second semiconductor type.

3. The process according to claim 1, wherein after formation of said second semiconductor layer, heating at a forming temperature of said second semiconductor layer is maintained.

4. The process according claim 1, wherein said layer structure comprises the lower cladding layer, a quantum well structure and an upper cladding layer, said lower cladding layer is formed on n-type InP, said first semiconductor layer is formed on Zn-doped p-type InP and said second semiconductor layer is formed of n-type InP.

5. The process according to claim 2, wherein after formation of said second semiconductor layer, heating at a forming temperature of said second semiconductor layer is maintained.

6. A semiconductor layer structure prepared by the process of claim 1 or 2.

7. The process according to claim 5, wherein said layer structure comprises the lower cladding layer, a quantum well structure and an upper cladding layer, said lower cladding layer is formed on n-type InP, said first semiconductor layer is formed on Zn-doped p-type InP and said second semiconductor layer is formed of n-type InP.

8. The process according to claim 5, wherein said layer structure comprises a lower cladding layer, a quantum well structure, said lower cladding layer is formed of n-type semiconductor, said first semiconductor layer is formed of p-type semiconductor and said second semiconductor layer is formed of n-type semiconductor.

9. The process according to claim 3, wherein said layer structure comprises the lower cladding layer, a quantum well structure and an upper cladding layer, said lower cladding layer is formed on n-type InP, said first semiconductor layer is formed on Zn-doped p-type InP and said second semiconductor layer is formed of n-type InP.

10. The process according to claim 3, wherein said layer structure comprises a lower cladding layer, a quantum well structure, said lower cladding layer is formed of n-type semiconductor, said first semiconductor layer is formed of p-type semiconductor and said second semiconductor layer is formed of n-type semiconductor.

11. The process according to claim 2, wherein said layer structure comprises the lower cladding layer, a quantum well structure and an upper cladding layer, said lower cladding layer is formed on n-type InP, said first semiconductor layer is formed on Zn-doped p-type InP and said second semiconductor layer is formed of n-type InP.

12. The process according to claim 2, wherein said layer structure comprises a lower cladding layer, a quantum well structure, said lower cladding layer is formed of n-type semiconductor, said first semiconductor layer is formed of p-type semiconductor and said second semiconductor layer is formed of n-type semiconductor.

13. The process according to claim 1, wherein said layer structure comprises a lower cladding layer, a quantum well structure, said lower cladding layer is formed of n-type semiconductor, said first semiconductor layer is formed of p-type semiconductor and said second semiconductor layer is formed of n-type semiconductor.

* * * * *